United States Patent [19]
White

[11] Patent Number: 6,042,995
[45] Date of Patent: Mar. 28, 2000

[54] LITHOGRAPHIC PROCESS FOR DEVICE FABRICATION USING A MULTILAYER MASK WHICH HAS BEEN PREVIOUSLY INSPECTED

[75] Inventor: Donald Lawrence White, Morris Plains, N.J.

[73] Assignee: Lucent Technologies Inc., Murray Hill, N.J.

[21] Appl. No.: 08/987,491

[22] Filed: Dec. 9, 1997

[51] Int. Cl.[7] .............................. G01N 21/88; G03F 7/00
[52] U.S. Cl. .............................. 430/311; 430/5; 430/396; 430/30; 356/124; 356/124.5; 356/389; 356/445; 356/239
[58] Field of Search ................................ 430/5, 311, 322, 430/396, 30; 264/406; 356/51, 71, 302, 305, 352, 124, 124.5, 389, 445, 448, 239

[56] References Cited

U.S. PATENT DOCUMENTS

| | | | |
|---|---|---|---|
| 5,162,867 | 11/1992 | Kohno | 356/237 |
| 5,710,067 | 1/1998 | Foote et al. | 437/238 |
| 5,795,684 | 8/1998 | Troccolo | 430/5 |

OTHER PUBLICATIONS

"Imaging of EUV Lithographic Masks with Programmed Substrate Defects", by Kguyen, K. et al., *OSA Proceedings on Extreme Utraviolet Lithography*, vol. 23, pp. 193–203 (1994).

Lin et al., J. Vac. Sci. Technol. B, Minimum Critical Defects in Extreme–Ultravoilet Lithography Masks, vol. 15, pp. 2467–2470, Nov./Dec. 1997.

*Primary Examiner*—Sharon Gibson
*Assistant Examiner*—Jill N. Holloman
*Attorney, Agent, or Firm*—Richard J. Botos

[57] ABSTRACT

A lithographic process for semiconductor device fabrication is disclosed. In the process a patterned mask having a multilayer film formed on a substrate is illuminated by extreme ultraviolet (EUV) radiation and the radiation reflected from the pattern mask is directed onto a layer of energy sensitive material formed on a substrate. The image of the pattern on the mask is thus introduced into the energy sensitive material. The image is then developed and transferred into the underlying substrate. The multilayer film is inspected for defects by applying a layer of energy-sensitive film (called the inspection film) in proximity to the multilayer film and exposing the energy-sensitive material to EUV radiation. The thickness of the multilayer film is such that a portion of the EUV radiation is transmitted through the inspection film, reflected from the multilayer film and back into the inspection film. The exposed inspection film is then developed, and the developed inspection film is inspected to determine if it indicates the presence of defects in the underlying multilayer film.

9 Claims, 3 Drawing Sheets

LITHOGRAPHIC PROCESS FOR DEVICE FABRICATION USING A MULTILAYER MASK WHICH HAS BEEN PREVIOUSLY INSPECTED

BACKGROUND OF THE INVENTION

1. Technical Field

The present invention is directed to lithographic processes for device fabrication and, in particular, to such processes that utilize reflective masks with multilayer films for patterning radiation.

2. Art Background

In lithographic processes for device fabrication, radiation is typically projected onto a patterned mask and the radiation transmitted through the mask is further transmitted onto an energy sensitive material formed on a substrate. Transmitting the radiation through a patterned mask patterns the radiation itself and an image of the pattern is introduced into the energy sensitive material when the energy sensitive resist material is exposed to the patterned radiation. The image is then developed in the energy sensitive resist material and transferred into the underlying substrate. An integrated circuit device is fabricated using a series of such exposures to pattern different layers formed on a semiconductor substrate.

Patterned masks do present certain problems as well as advantages. The advantage of a patterned mask is speed. In one brief exposure, a pattern is introduced over a substantial surface area of the substrate. This is considerably faster than a direct-write exposure technique, where a beam of radiation (most typically an electron beam) is used to "write" the pattern in the energy sensitive material. In a direct-write technique, an area of the energy-sensitive material only as large as the area of the beam is exposed at a given moment.

The disadvantage of patterned masks is that they must be extremely precise. One defect in a mask, if undetected, can result in the loss of hundreds and even thousands of integrated circuit chips. Therefore, masks must not only be manufactured precisely, they must be carefully inspected so that any mask defects are detected before the mask is used in a manufacturing process.

Mask inspection techniques, like the masks themselves, are adapted to be compatible with the specific lithographic process in which the mask is used. The materials of the mask are selected to be compatible with the exposing radiation. For example, in lithographic processes that use optical or ultraviolet radiation as the exposing radiation, glass masks (i.e. a metal patterned film formed over a glass substrate that is transparent to the exposing radiation) are typically used. In a projection lithography tool that uses electrons, the mask consists of higher density regions of material that scatter electrons incident thereon (the blocking regions) and much lower density regions that do not scatter electrons incident thereon (the non-blocking regions).

As design rules (i.e. the size of the features in the integrated circuit pattern) decrease from 0.5 $\mu$m to 0.35 $\mu$m to 0.25 $\mu$m to 0.18 $\mu$m, etc., the wavelength of the exposing radiation also decreases because the smallest feature a projection lens can resolve is proportional to the wavelength. For fabricating integrated circuit devices with 0.1 $\mu$m size features, exposing radiation in the wavelength range referred to as extreme ultraviolet (EUV) has been proposed.

Masks that are compatible with EUV radiation are somewhat different than masks that are compatible with longer wavelengths of light because the glass substrates that are typically used for optical lithography are not transparent to EUV radiation (i.e. radiation with a wavelength in the range of about five nm to about fifty nm).

In order to overcome this problem, EUV masks are substrates (typically fused silica or silicon) that are coated with a multilayer film that reflects the EUV radiation. Over this film is a patterned layer which absorbs EUV radiation. Thus, the radiation reflected from the mask surface is patterned. The nature of the EUV masks makes it especially difficult to inspect for the presence of certain types of defects.

For example, some defects on the patterned material are readily observed optically. This is because the EUV mask is typically four times larger than the pattern that is formed on the device substrate. Thus a 0.15 $\mu$m feature on the device substrate would be formed using a corresponding feature on the mask that was four times larger (i.e. 0.6 $\mu$m). A feature of such size is readily observed using optical inspection techniques. The presence of particulate contamination, i.e. dirt particles, which can also be a source of defects, is also detected by optical examination.

However, some defects are not susceptible to detection using optical inspection because they do not cause an observable change in the visible wavelength radiation reflected therefrom. Examples of such defects include defects which cause reduced reflectivity from the film in the region of the defect or defects which shift the phase of the EUV radiation reflected from the film in the region of the defect. The nature of these defects is that they often cannot be detected using optical inspection techniques because, at the optical inspection wavelengths, these types of defects are invisible. However, these defects will affect the EUV radiation that falls within the reflective bandpass of the multilayer. Consequently, if such defects are not detected, the resulting mask will produce a defective pattern on the device wafer. Since the pattern on the device wafer is four times smaller than the pattern on the mask, the defect in the pattern could escape optical detection, but manifest itself in the defective operation of the resulting device.

Therefore, it is desired to inspect the mask substrate for all defects before the patterned multilayer film is formed on the mask, and further desired to inspect the patterned mask for defects before it is used to form a pattern on a device wafer. The sooner that a defect is detected, the fewer the adverse consequences that will result from the defect. However, in order to detect defects that are not susceptible to detection by optical techniques, the inspection must be made using radiation in the range of wavelengths that are reflected by the multilayer film (i.e. the EUV wavelengths).

One method for inspection of EUV masks at an EUV wavelength is described in Nguyen, K. B., et al., "Imaging of EUV Lithographic Masks with Programmed Substrate Defects" *OSA Proceedings on Extreme Ultraviolet Lithography*, Vol. 23, pp. 193–203 (1994). In the technique described in Nguyen et al., incident EUV radiation is directed onto the mask, and the reflected radiation is imaged onto a film of energy sensitive material. The resulting image in the energy sensitive material is developed, and the pattern is inspected for defects attributable to the mask. This technique is limited because certain defects in the mask (e.g. a slight reduction in the reflectivity of the substrate or a defect that causes only a slight phase change in the reflected radiation) are not likely to be detected. Furthermore, the technique is time consuming since multiple separate exposures are required to transfer an image of the entire mask into the energy sensitive resist material.

Accordingly, a technique for inspecting EUV masks that is both fast and capable of detecting even very subtle defects that are not detected by the currently available techniques is desired.

SUMMARY OF THE INVENTION

The present invention is directed to a lithographic process for device fabrication in which radiation in the wavelength range of about five nm to about 50 nm (referred to hereinafter as the extreme ultraviolet range) is transmitted onto a previously inspected mask with a desired pattern. The radiation patterned by the mask is projected onto a substrate coated with a layer of energy sensitive material (typically a resist-coated silicon wafer). The mask is inspected by a technique in which an energy sensitive material (a separate and distinct layer from the layer of energy sensitive material formed on the substrate) is interposed between a source for EUV radiation and a mask blank. This separate and distinct layer of energy sensitive material is positioned in such a way that variations of reflectivity and phase in the mask blank (referred to collectively herein as mask blank information) are recorded in the energy sensitive film. For purposes of the present invention, the mask blank is a substrate (e.g. silicon, fired silicon) on which is formed a reflective film having a plurality of layers. It is advantageous if the mask blank does not have a patterned layer that absorbs EUV radiation formed thereon at the time it is inspected. In this embodiment, a patterned layer of material that absorbs EUV radiation is formed on the mask blank after the mask blank is inspected. In an alternate embodiment, the patterned layer of EUV-absorbing material is formed on the mask blank prior to inspection.

In the process of the present invention, the layer of energy sensitive material is either formed on the mask blank or on a membrane that is partially transparent to EUV radiation. Examples of suitable membranes include boron-doped silicon and polysilicon with thicknesses less than one micron. The energy sensitive material is interposed between the source for EUV radiation and the mask blank. EUV radiation is then directed onto the energy sensitive material. In the embodiment wherein the energy sensitive material is formed on the membrane, the membrane is between the source of the EUV radiation and the energy sensitive material. The layer of energy sensitive material must be located no more than about one half a coherence length from the surface of the mask. The coherence length is related to the source of the exposing radiation, and the wavelength of the exposing radiation is about 5 to about 50 nm. Typically, for a synchrotron source the the energy sensitive material must be located no more than about one micron from the surface of the mask. The thickness and the EUV absorbance of the energy sensitive material is such that the incident radiation is not completely absorbed by the energy sensitive material.

Since the mask blank has an EUV reflective film formed thereon, EUV radiation that is transmitted through the energy sensitive material is reflected from the reflective film back through the energy sensitive material. After the energy sensitive material is so exposed, it is subjected to conditions that dissolve or otherwise remove the exposed energy sensitive material (in the case of positive energy sensitive materials). This is referred to as development. In an alternate embodiment, the unexposed portion of the energy sensitive material (in the case of negative energy sensitive materials) is removed after the energy sensitive material is exposed to radiation.

The energy sensitive material and the developer are selected so that the rate at which the energy sensitive resist material is dissolved is related to the amount of radiation received by the energy sensitive resist material. The amount of radiation received by the energy sensitive resist material is typically referred to as a dose. If the dose of radiation received by the energy sensitive resist material varies, then the rate at which the layer of energy sensitive resist material is dissolved by the developer will also vary. If the reflective film is completely uniform, then the dose of radiation received by the layer of energy sensitive resist material will be uniform. Consequently, the rate at which the energy sensitive resist material is dissolved by the developer will be uniform.

Thus, the uniformity of the multilayer film is determined by inspecting the layer of energy sensitive material after it has been exposed to radiation and partially developed. If the surface of the energy sensitive material is uniform, this indicates that the underlying multilayer reflective film is defect-free. If the surface of the energy sensitive material is not uniform, however, this indicates the presence of a defect as described below.

The energy sensitive material is inspected using optical techniques to ascertain thickness variations, variations in absorbance, and variations in the index of refraction in the film that are attributable to the presence of a defect in the EUV reflective film. Such variations are attributable to defects because they result from variations in the mask blank reflectivity.

The developed film is inspected using conventional optical inspection techniques and equipment well known to one skilled in the art. A variety of optical inspection techniques are contemplated as suitable for this purpose. For example, a Tencor Surfscan 6420 Wafer Surface Analysis System from KLA-Tencor of Milpitas, Calif. is used for inspecting the developed film. The apparatus illuminates the developed film with a beam of visible radiation. If the film is perfectly smooth the beam of visible radiation will be reflected specularly. The presence of visible radiation in directions other than the specular direction (scattered light) indicates the presence of a small defect in the developed film.

Optical inspection techniques that utilize a beam of radiation directed onto the developed film at a grazing angle are also contemplated as suitable. A phase contrast microscope is used in this technique.

In another embodiment, an interference microscope is used to perform the optical inspection. The interference microscope divides the incident beam into two beams, one of which is a reference beam. The other beam is transmitted through the exposed and developed resist material. Since the other beam is reflected from the substrate, it is transmitted through the test material twice, once as incident radiation and once as reflected radiation. Any variation in thickness or in index of refraction changes the phase of a portion of the beam. The beam reflected from the defect is then recombined with the reference beam. The interference between the two beams causes the combined beams to have a certain intensity. That intensity is different from the intensity of a combined beam wherein the reflected beam is not reflected from a defect. Any observed differences in intensity are indicative of the presence of a defect. These inspection techniques do not require the use of high resolution EUV projection or scanning optics to inspect the exposed film, and are therefore less expensive and quicker than current techniques for inspecting EUV masks.

After the mask blank is inspected, the inspected mask with a patterned layer of absorber material formed thereon is used in the previously described lithographic process. After the image of the mask pattern has been transferred into the layer of energy sensitive material formed on the substrate, the image of that pattern is developed and the developed pattern is transferred into the underlying substrate. The specific steps of development and pattern transfer are not discussed in detail herein. Suitable materials and conditions for image development and pattern transfer are well known to one skilled in the art.

DETAILED DESCRIPTION

Figure 1:
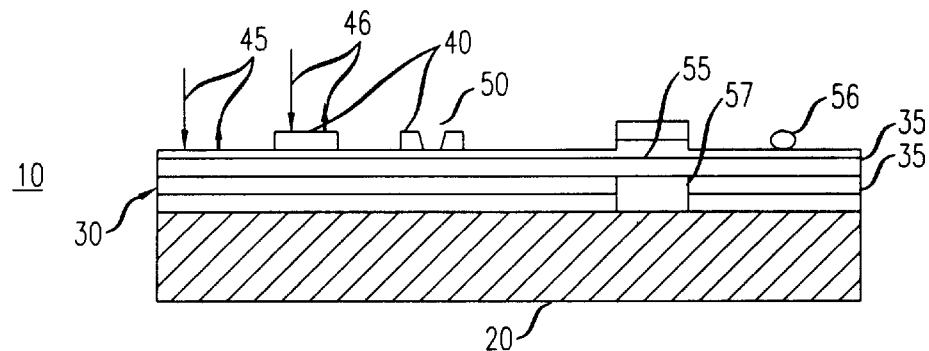
FIG. 1 illustrates the effect of mask defects on the light reflected therefrom.

FIG. 1 illustrates a mask used in a lithographic process for device fabrication in which the wavelength of the exposing radiation is in the EUV range. The mask 10 is formed on a substrate 20. Examples of suitable mask substrates include silicon or a polished ceramic material with a low coefficient of thermal expansion. The substrate 20 has a reflective film 30 formed thereon. The reflective film 30 is made of a plurality of layers 35. The reflective film 30 has formed thereon a patterned film 40, which absorbs radiation in the EUV wavelength range. One example of a suitable absorber material is germanium.

EUV radiation 45 that is incident on the multilayer film 30 is substantially reflected therefrom. EUV radiation 46 that is incident on the absorber material 40, is substantially absorbed thereby.

In the process of the present invention, the mask 10 is inspected for defects in the absorber layer 40, the multilayer film 30, and the mask substrate 20. As previously noted, a mask with defects, if used, will produce hundreds or thousands of defective integrated circuit chips. Some defects in an EUV mask are easier to observe than others. For example, a pinhole defect 50 in the absorber material 40 is readily detected by conventional optical techniques because the reflectivity of the absorber layer and the multilayer film are very different. Such a defect in the absorber layer is thus easily detected and easily repaired.

Particles are another source of mask defects that are sometimes detectable by conventional optical inspection techniques. A particle 56 is illustrated in FIG. 1. If the multilayer film is formed over debris 57 on the substrate surface, an irregularity 55 in the surface of the multilayer film will result. Also, if the multilayer film is formed over a scratch in the substrate, an irregularity in the multilayer film will result. These irregularities, if large enough, can be detected by optical inspection techniques. However, even if the resulting irregularities are not detectable by optical inspection, they can still adversely affect mask performance. One skilled in the art will appreciate that whether or not such defects will be detected depends upon the size of the defect and the wavelength of the radiation used for inspection. For example, a 3 nm irregularity in the multilayer film is not detectable when inspected using 600 nm wavelength radiation. However, the same 3 nm irregularity is detectable when the wavelength of the radiation used for inspection is 14 nm. However, as previously noted, it is not desirable to inspect for defects at the EUV wavelength.

Some defects in multilayer films are not easily detected using optical techniques for reasons other than the size of the defect. This is because visible light incident on the multilayer film behaves as if the multilayer film was a metal film. Since the wavelength of light is so much greater than the multilayer thickness, even if light penetrates into the multilayer films, fine details in the layers will be averaged out and areas with subtle defects will look like normal areas.

Although small variations in the multilayer film, i.e., variations as small as a nanometer or two, will cause very little change in the light reflected from the multilayer film, such small variations will change the phase and reflectivity of the radiation reflected from the film. This is because the multilayer film behaves like a resonant structure when EUV light is incident thereon. Consequently, only a small percentage of the bandwidth of the incident radiation is reflected from the multilayer film. A variation of even a nanometer or two can cause a dramatic change in the phase or the reflectivity of the reflected radiation in the reflected wavelength range.

For example, a variation of one nanometer in the height of the multilayer film will alter the phase of the reflected radiation in the band of 13.3 nm to 13.7 nm by 50 degrees, whereas the same defect would alter the phase of 633 nm light by only about one degree. It is for these reasons that subtle errors in the multilayer, e.g. errors such as layer spacing or a variation in the diffusion of material from one layer to another, can alter the properties of the reflected wave. Such defects would be transmitted to the image transferred into the EUV sensitive resist on the substrate, even though such an error is not detectable by optical inspection techniques.

In the process of the present invention, the mask is inspected by a technique that observes whether the mask has errors which would be transmitted to the EUV resist without have to use EUV radiation for the inspection. In a preferred embodiment, after the mask blank has been inspected according to the process of the present invention, it is subjected to a conventional optical inspection after the patterned layer of absorber material has been formed thereon.

In the claimed process, the mask blank is fabricated using conventional techniques well known to one skilled in the art. In one embodiment of the present invention illustrated in FIG. 2, after the multilayer-coated mask blank 200 is fabricated (but before the patterned layer of absorber material is formed thereon), a layer of energy sensitive material 220 that is sensitive to radiation with wavelengths in the EUV range is formed on the multilayer film 210. Thereafter, the energy sensitive material (also referred to herein as a resist material) is exposed to EUV radiation.

Figure 3:
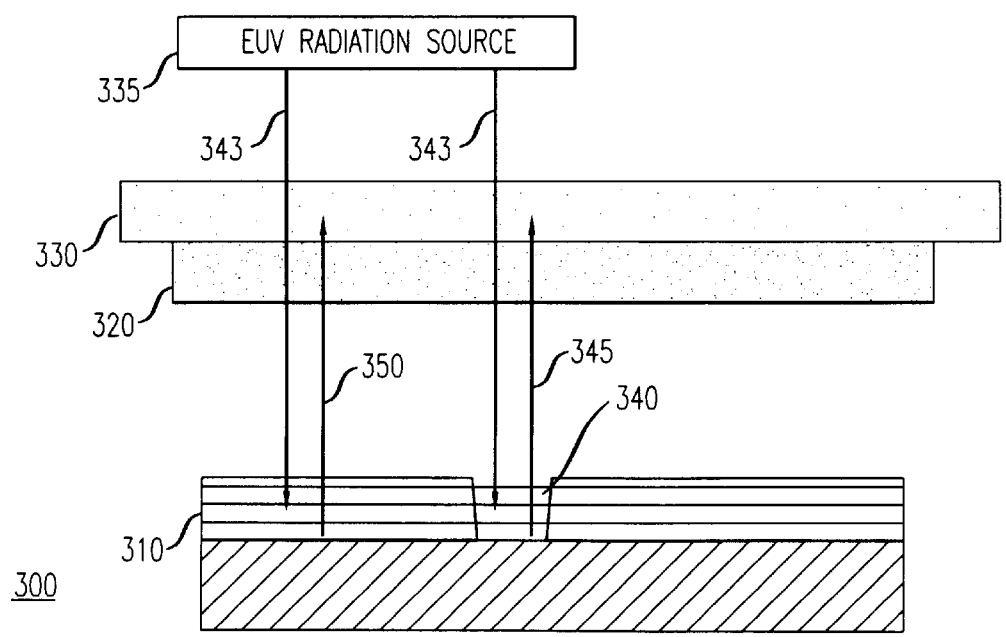
FIG. 3 illustrates the embodiment of the present invention wherein the layer of energy sensitive material is formed on a membrane and the membrane is interposed between the source of EUV radiation and the mask blank.

In a second embodiment of the present invention illustrated in FIG. 3, after the multilayer-coated mask blank 300 is fabricated (but before the patterned layer of absorber material is formed thereon), the layer of energy sensitive material 320 that is sensitive to light with wavelengths in the EUV range is formed on a membrane 330. The membrane 330 is a material that is transparent to light in the EUV wavelength range. Silicon is an example of a suitable membrane material. The membrane 330 with the layer of EUV-sensitive resist 320 formed thereon is placed between a source for EUV radiation 335 and the multilayer film 310 of the mask blank 300. The EUV-sensitive resist 320 must be within one-half a coherence length from the surface of the substrate in this embodiment. The coherence length is the square of the wavelength divided by the source bandwidth. For example, if the wavelength of the exposing radiation is 13 nm and the bandwidth of the source is 0.6 nm, then the coherence length is about 0.3 µm. In this example, the EUV-sensitive material is within about 0.15 µm of the substrate surface.

Figure 2:
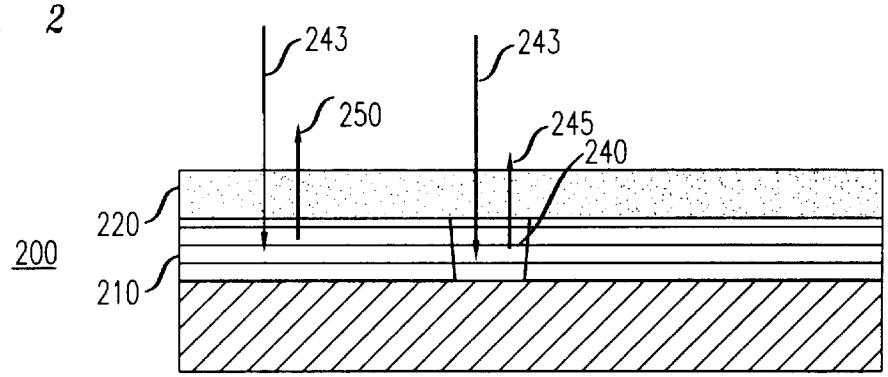
FIG. 2 illustrates the embodiment of the present invention wherein the layer of energy sensitive material is formed directly on the mask blank.

In either embodiment, the energy sensitive material is then subjected to conditions that dissolve the energy sensitive material at a rate that is selective and dependent of the dose of radiation received by the energy sensitive resist material. The energy sensitive material is subjected to these conditions for a period of time to dissolve the energy sensitive material through a portion of its thickness. A sufficient portion of the resist material remains after development to be inspected for variations attributable to defects in the multilayer film. How a defect manifests itself in the energy sensitive film depends upon the proximity of the resist film to the multilayer film. Referring to FIG. 2, in the embodiment of the present invention wherein the energy sensitive film 220 is applied over the multilayer film 210, a defect 240 in the multilayer film 210 causes a change in the phase or amplitude of the reflected EUV radiation 245 (the incident radiation is represented by arrows 243) which causes an anomalous exposure in the region of the energy sensitive material 220 adjacent to the defect 240 relative to the region of the energy sensitive material which receives reflected radiation 250 from a point on the multilayer film 210 that does not have such a defect.

Referring to FIG. 3, in the embodiment of the present invention wherein the energy sensitive film 320 is applied on the membrane 330 and separated from the multilayer film 310, a defect 340 in the multilayer film 310 causes a change in the reflectance or phase of the reflected EUV radiation 345 (the incident radiation is depicted as 343) which causes an anomalous exposure in the region of the energy sensitive material 320 that is exposed to the radiation 345 reflected from the defect relative to the region of the energy sensitive material which receives reflected radiation 350 from a point on the multilayer film 310 that does not have such a defect.

In either embodiment, the thickness of the energy sensitive material is less than about 50 nm. When the thickness of the energy sensitive material is so limited, the EUV radiation transmitted therethrough and onto the mask blank is not significantly attenuated.

After the energy-sensitive resist material is exposed to EUV radiation, some, but not all, of the resist is removed by the developer. The resist material is inspected by optical techniques for evidence of the presence of defects in either the multilayer film or the surface of the underlying substrate on which the multilayer film is formed. If the surface of the resist material is substantially flat, this indicates that the EUV radiation was uniformly reflected from the substrate surface, which in turn indicates that the mask blank has no defects. If the surface of the resist material has a non-uniformity, this indicates that the EUV radiation was not uniformly reflected from the substrate surface which in turn indicates the presence of a defect in the mask blank.

Figure 4:
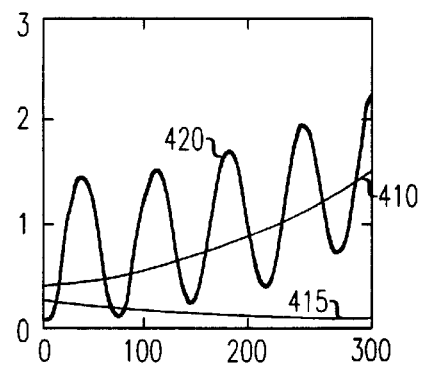
FIG. 4 illustrates the intensity of the EUV beam incident on the energy sensitive resist material, the intensity of the EUV beam reflected from the mask blank into the energy sensitive resist material, and the standing wave produced in the energy sensitive material from the interference between the incident and reflected EUV radiation.

In one embodiment, a developer solution is used to develop the "standing wave" pattern introduced into the energy sensitive material by virtue of its being exposed to both radiation from the energy source and radiation reflected from the substrate surface. FIG. 4 is instructive for understanding how such a pattern can reveal the presence of a defect in the film.

Specifically FIG. 4 is a graph of the intensity of EUV radiation as a function of the energy-sensitive resist material thickness (i.e. the thickness of the film above the surface of the multilayer film for the embodiment illustrated in FIG. 2). Dashed line 410 illustrates the intensity of the incident radiation from the radiation source as a function of film thickness where zero is the interface between the energy-sensitive resist material and the underlying multilayer film. Line 415 illustrates the intensity of the reflected radiation of the light that is reflected from the multilayer film back into the resist film as a function of film thickness. FIG. 4 illustrates that the intensity of the light decreases as it travels through the resist film as both incident and reflected radiation. The standing wave that is produced by the interference between these two beams is the line 420 in FIG. 4. Because of the standing wave in the resist material, certain areas are underexposed and certain other areas are overexposed. Depending upon the particular resist material and the developer, one of either the underexposed area or the overexposed area is developed more quickly than the other. The developed pattern is then examined to determine if there are variations therein that are inconsistent with the standing wave.

A change in either the reflectance or the phase of the reflected radiation that is associated with a defect in the film will reveal itself when the energy sensitive resist material is developed. As previously noted, the energy-sensitive resist material that is exposed to radiation reflected from the defect is different from the radiation-sensitive resist material that is reflected from the defect-free regions of the film. These differences manifest themselves as differences in film thickness when the film is developed.

It is advantageous if the resist material is "high contrast," i.e., the dissolution rate of the exposed resist material is proportional to at least the third power of the EUV radiation dose. Such a relationship between dose and dissolution rate ensures that the thickness of the developed resist film will be different at the site in the resist film that corresponds to the defect in the multilayer film. The presence of the defect is observed when the resist film is developed, because a different amount of the resist is removed in the region proximated to the defect(s) than in the remaining portion of the resist film. When the defect manifests itself as a sharp-edged irregularity in the surface of the resist, it is more readily detected by optical inspection using a tool that detects scattered light (e.g. the Tencor Surfscan or phase contrast microscope) rather than an interferometer. Conversely, when the defect manifests itself as a smooth-edged irregularity in the surface of the resist, it is more readily detected by optical inspection using an interferometer than a phase contrast microscope or light scattering detector.

Figure 5:
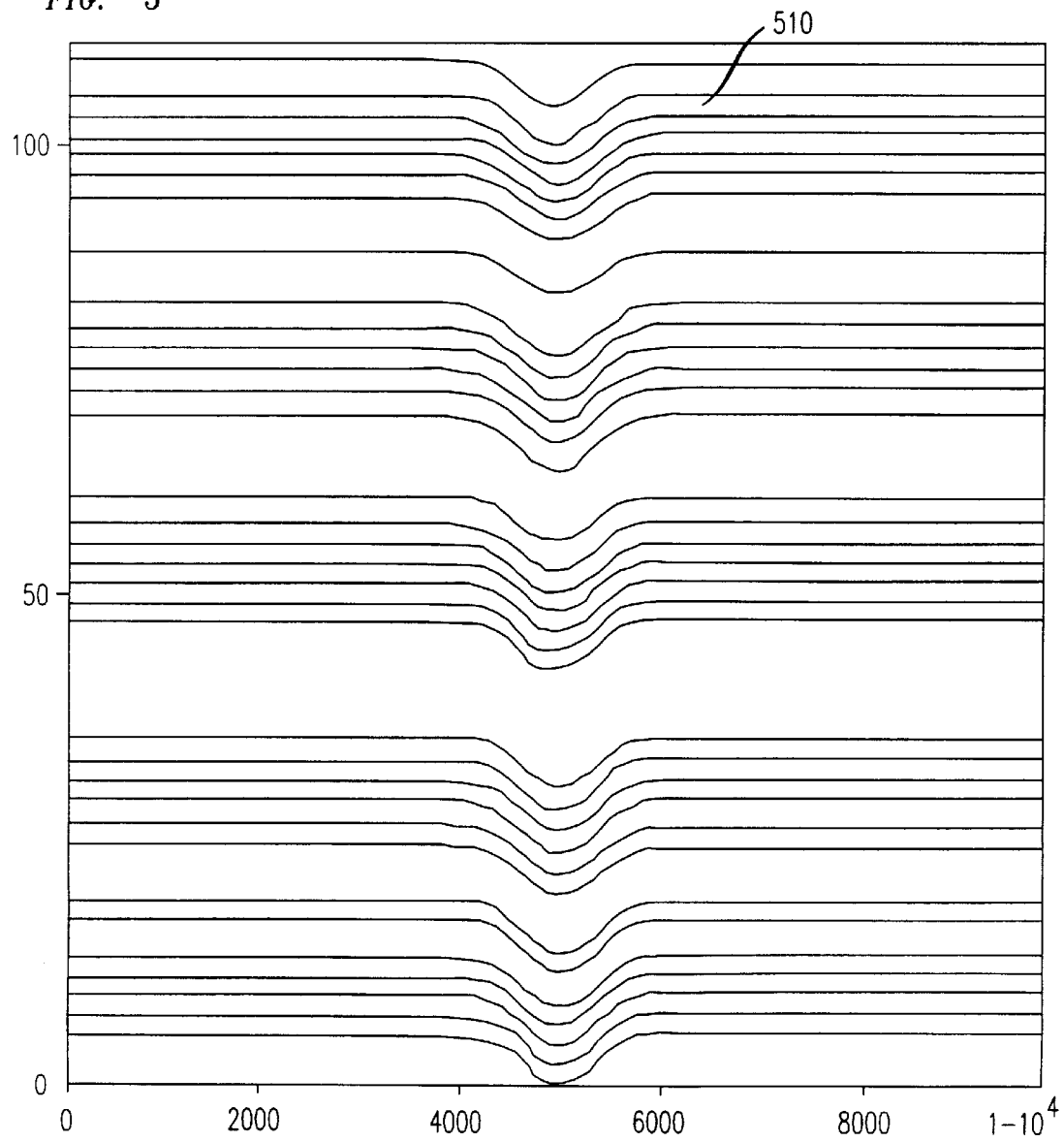
FIG. 5 illustrates a contour map of EUV intensity in the energy sensitive resist material as a function of position on a mask blank which has a phase defect in the multilayer film formed thereon.

The radiation reflected from a defect that causes either a change in phase or a change in the reflectivity has a different effect on the energy sensitive resist material than the radiation reflected from the multilayer film without the defect. This is illustrated by FIG. 5, which is a contour map of the intensity of radiation in an EUV resist film that has a thickness (30 nm) that was greater than one period of the standing wave generated in the resist film by exposure to EUV radiation. The horizontal bands 510 indicate the intensity contours of the EUV radiation as a function of the resist thickness (the vertical axis). The horizontal axis indicates the particular location on the surface of the resist.

The contour map illustrated in FIG. 5 was generated using a MathCad program and graphics. FIG. 5 displays the intensity variation in a section of energy sensitive material. The EUV wavlength was 13.6 nm and the multilayer reflectivity was 65 percent. The resist absorbance used was 0.02/nm. The modeled multilayer film had a 0.1 $\mu$m-wide defect therein which was a 30 degree phase defect. The presence of the 30 degree phase defect was the source of the dip that appears in the contour map of FIG. 5. FIG. 5 illustrates that the intensity of the radiation as a function of film thickness changed at the point on the horizontal axis that corresponds to the position of the 0.1 $\mu$m-wide, 30 degree phase defect.

Phase defects result from a variety of defects in the mask blank. For example, a stacking fault during the formation of the multilayer film or the presence of a scratch on the mask substrate will cause a phase defect in the energy sensitive resist film.

Figure 6:
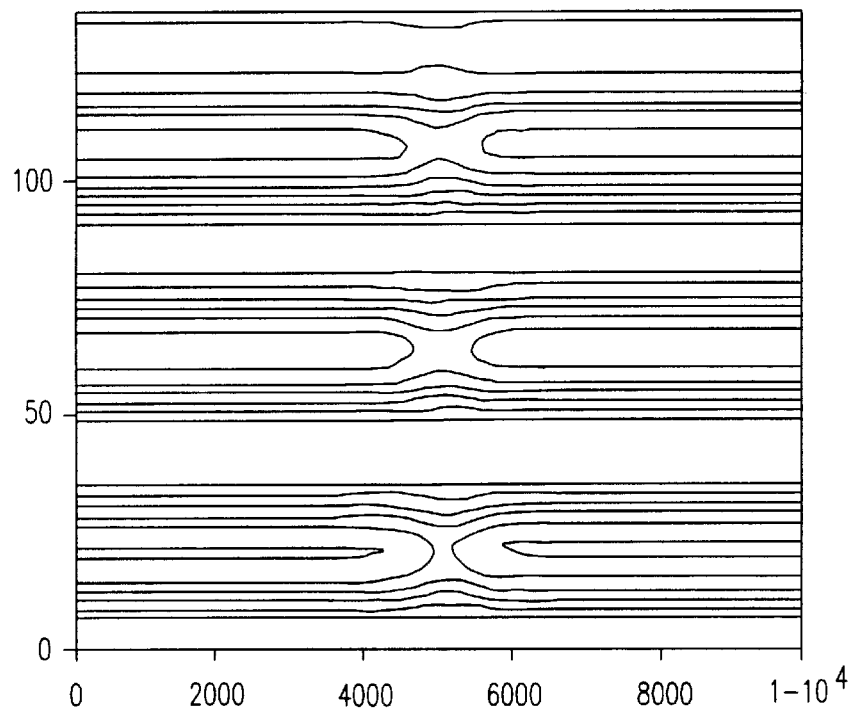
FIG. 6 illustrates a contour map of EUV intensity in the energy sensitive resist material as a function of position on a mask blank which has a defect in the reflectivity of the multilayer film formed thereon.

FIG. 6 illustrates a contour map of a multilayer film with a 0.1 $\mu$m-wide defect in which the reflectance is reduced by ten percent. FIG. 6 illustrates that the intensity at the point in the resist that corresponds to the location of the defect as a function of the resist thickness was different than at other locations in the resist. The reason for the difference is that the constructive interference at the location in the resist that received light reflected from the defect was different from the constructive interference at the other locations in the resist material.

Figure 7:
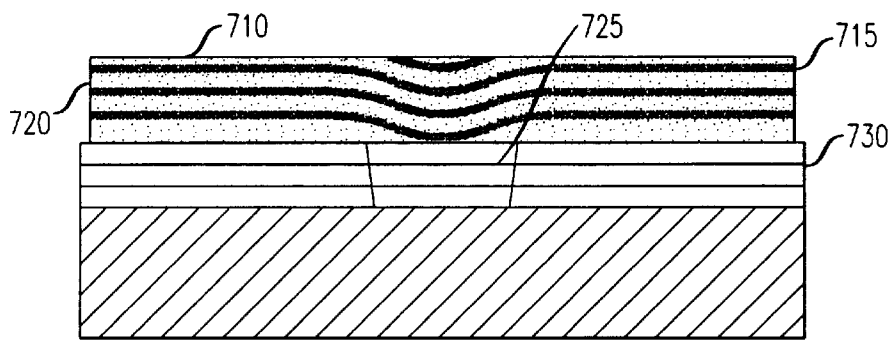
FIG. 7 illustrates the effect of non-linear resist development over a phase defect in the multilayer film.

The defect in a multilayer film will often manifest itself in the exposed and partially developed resist as a variation in resist thickness. However that difference in thickness could be less than one nanometer, which is a difficult difference to observe. In such an instance it is advantageous to select the thickness of the energy sensitive material to amplify the "signature" of a defect in the multilayer film so that its presence is more easily detected. It is advantageous to select the thickness of the energy sensitive material such that the top layer of the resist would be easily dissolved during development because of the intensity introduced into the resist at that point in the resist thickness. Referring to FIG. 7, the thickness of the energy sensitive material 710 is selected to be larger than several periods of the standing wave generated in the resist by the incident and reflected EUV radiation. The thickness is also selected so that the surface will receive an amount of radiation that will cause the surface to dissolve preferentially. If the energy sensitive material 710 is a positive-acting resist, then the thickness is tailored so that a node (i.e. a point of near maximum intensity) in the standing wave occurs at the surface of the resist. If the energy sensitive material 710 is a negative-acting resist, then the thickness is tailored so that an antinode (i.e., a point of near minimum intensity) occurs at the surface of the resist. This concept is illustrated in FIG. 7 by the alternating dark 715 and light 720 bands in the resist material 710. For example, if the energy sensitive material 710 is a positive-acting resist and the dark regions 715 represent planes of high intensity radiation, then the dark regions 715 will develop out more quickly than the light regions 720.

Above the defect 725 in the multilayer film 730, the planes of high intensity and low intensity radiation generated by the standing wave are displaced, which is illustrated by the displacement of the dark 715 and light 720 bands over the defect 725. Because of this displacement, the development rate for the energy-sensitive material 710 over the defect 725 will be noticeably different from the development rate for the energy-sensitive material 710 over the other portions of the multilayer film 730. The difference in development rate amplifies the geometric change in the exposed resist caused by the defect in the multilayer film. Specifically, a less than one nanometer dispersion in the exposed energy sensitive material 710 could become several nanometers in thickness after development because of this difference in the development rates.

Figure 8:
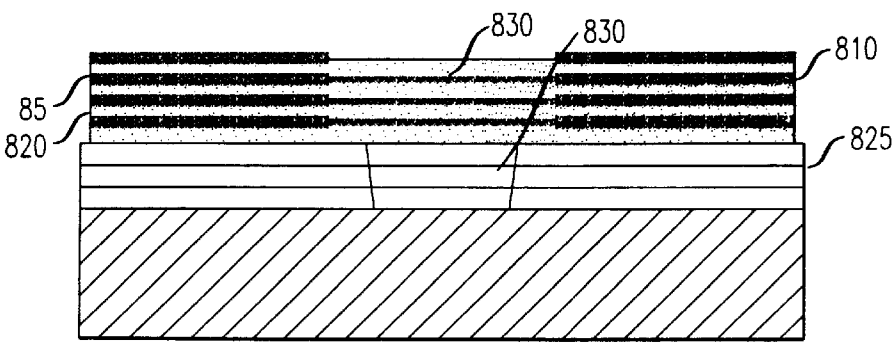
FIG. 8 illustrates the effect of non-linear development over a defect in the reflectivity of the multilayer.

FIG. 8 illustrates the exposed EUV sensitive resist film 810 formed over a multilayer film 825 with a reflectance defect 830 therein. The EUV sensitive resist film is a negative-working resist in that the resist that is exposed to low intensity radiation dissolves more quickly than the resist exposed to high intensity radiation. Again the dark 815 and light 820 bands in the energy-sensitive film represent alternating bands of high and low intensity radiation generated by the standing wave that results when the resist is exposed to EUV radiation. As a result of the reflectance defect the intensity of the standing wave is reduced above the defect 830. Consequently, the regions of resist that are exposed to high intensity radiation are thinner in the region of the energy sensitive film 810 over the defect 830 than in the other regions of the resist. It is for this reason that the energy-sensitive resist material 810 overlying the defect 830 develops out more quickly than the other portions of the energy-sensitive material 810.

In the embodiment of the present invention wherein the energy sensitive resist is a positive resist, the underexposed bands in the resist that occur due to the standing wave antinodes develop more slowly and act as a "stop" to the development of the energy sensitive resist. However, in the area of the energy sensitive resist material overlying a defect, the interference is not as complete at the antinode. Thus the "stop" layer that corresponds to the antinode over the defect dissolves faster than the "stop" layer that corresponds to the antinode over the defect-free area of the film. The developer will break through the "stop" layer above the defect before it breaks through the "stop" layer over the defect-free area of the mask blank. As development proceeds, the difference between the development rate of the resist over the defect compared to the area over the defect-free area becomes greater. Thus, the size of the irregularity in the developed resist caused by a defect in the mask blank is larger than the size of the defect itself.

As illustrated in FIG. 5, the presence of a phase defect in the underlying mask blank does not affect the thickness of the bands in the exposed resist that are introduced by the standing wave. However, the standing wave pattern is changed in the area over the defect. Referring to FIG. 5, the bands bend in the area overlying the defect. These bends weaken the resistance of the stop layer to development. Thus, the development rate of a resist material in the area of an energy sensitive resist material overlying a phase defect is different from the development rate of the material overlying a defect-free area of the film. This difference is not as pronounced as the difference in development rates caused by the presence of a reflectivity defect, however.

The embodiment of the present invention wherein the energy-sensitive resist material is formed on a membrane, and not directly on the multilayer film, is advantageous because problems associated with removal of the developed resist from the multilayer are avoided. However, in this embodiment, the resist material should be less than the coherence length of EUV radiation away from the multilayer in order for standing waves to form in the energy sensitive resist material. If the energy-sensitive resist material is more than a coherence length of EUV radiation away from the multilayer film, a defect will still cause the energy sensitive material that receives radiation reflected from the defect to be exposed differently from the energy-sensitive material that receives radiation reflected from the other portions of the multilayer film. This difference in exposure will lead to a difference in development, which would indicate the presence of the defect.

After the energy-sensitive resist material is exposed to EUV radiation and developed, it is inspected to determine if there is a variation in the developed resist that is attributable to a defect in the multilayer film. Suitable examination techniques are the optical inspection techniques such as interferometry and dark field microscopy that were previously described. If a dark field microscope is used to inspect the developed energy-sensitive material, the defects (i.e. changes in resist thickness attributable to defects in the multilayer film) appear as spots of light on a dark background. Since the index of refraction of the resist is typically 1.6 to 1.8, and air is only 1, the defect caused an anomaly in the phase of the light used for inspection.

What is claimed is:

1. A process for device fabrication comprising:

transmitting radiation in a wavelength range of about five nm to about 50 nm onto a previously inspected mask that comprises a mask substrate on which is formed a multilayer film that substantially reflects radiation in the wavelength range over which is a patterned film of a material that substantially absorbs radiation in the wavelength range, wherein the mask substantially reflects the radiation in a desired pattern; and projecting the patterned radiation onto a substrate coated with a layer of energy sensitive material wherein the mask has been previously inspected by:

interposing an inspection layer, wherein the inspection layer is a layer of an energy sensitive material, between the mask substrate with the multilayer film formed thereon and a source for radiation having a wavelength of about five nm to about 50 nm;

directing the radiation onto the inspection layer;

transmitting at least a portion of the radiation through the inspection layer and onto the mask substrate with the multilayer film thereon, wherein at least a portion of the radiation is reflected back into the inspection layer wherein the inspection layer is positioned in such a way that mask blank information is recorded in the inspection layer;

developing the image; and inspecting the developed inspection layer.

2. The process of claim 1 wherein the mask substrate is selected from the group consisting of silicon substrates and ceramic substrates.

3. The process of claim 1 wherein the patterned film is on the multilayer film during the inspection steps.

4. The process of claim 1 wherein the inspection layer is directly on the multilayer film during the inspection steps.

5. The process of claim 1 wherein the inspection layer is formed on a membrane that is at least partially transparent to radiation in the wavelength range.

6. The process of claim 5 wherein the membrane is selected from the group consisting of boron-doped silicon and polysilicon and wherein the thickness of the membrane is less than about one micron.

7. The process of claim 5 wherein the inspection layer is either in contact with the mask blank or no more than one half a coherence length from the substrate.

8. The process of claim 1 wherein the patterned radiation forms an image of the pattern in the layer of energy sensitive resist material coated on the substrate and further comprising:

developing the image of the pattern in the layer of energy sensitive resist material coated on the substrate; and transferring the developed pattern into the underlying substrate.

9. The process of claim 1 wherein the radiation projected onto the inspection layer and the radiation reflected from the substrate with the multilayer film formed thereon into the inspection layer combine to form a standing wave in the inspection layer and wherein the thickness of the inspection layer is greater than one period of the standing wave.

* * * * *